US011259407B2

(12) United States Patent
Shim et al.

(10) Patent No.: US 11,259,407 B2
(45) Date of Patent: Feb. 22, 2022

(54) ELECTRICAL CONNECTING DEVICE AND ELECTRONIC DEVICE INCLUDING THE SAME

(71) Applicant: Samsung Electronics Co., Ltd., Gyeonggi-do (KR)

(72) Inventors: Jongwan Shim, Gyeonggi-do (KR); Bumhee Bae, Gyeonggi-do (KR); Younho Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 72 days.

(21) Appl. No.: 16/813,897

(22) Filed: Mar. 10, 2020

(65) Prior Publication Data
US 2020/0375026 A1 Nov. 26, 2020

(30) Foreign Application Priority Data
May 21, 2019 (KR) .......................... 10-2019-0059620

(51) Int. Cl.
*H05K 1/02* (2006.01)
*H04B 1/38* (2015.01)
(Continued)

(52) U.S. Cl.
CPC ............. *H05K 1/0281* (2013.01); *H04B 1/38* (2013.01); *H05K 1/118* (2013.01); *H05K 7/1407* (2013.01); *H05K 7/1422* (2013.01)

(58) Field of Classification Search
CPC ... H05K 1/11; H05K 1/14; H05K 1/18; H05K 1/114; H05K 1/118; H05K 1/181–188;
(Continued)

(56) References Cited

U.S. PATENT DOCUMENTS

| 6,617,518 B2* | 9/2003 | Ames ................... H01R 12/592 |
| | | 174/254 |
| 6,768,233 B2* | 7/2004 | Angerpointner ....... H01R 39/08 |
| | | 310/68 R |

(Continued)

FOREIGN PATENT DOCUMENTS

| CN | 101313439 A | 11/2008 |
| CN | 101384131 A | 3/2009 |
| KR | 10-1466605 B1 | 11/2014 |

OTHER PUBLICATIONS

International Search Report dated Jun. 17, 2020.

*Primary Examiner* — Tuan T Dinh
(74) *Attorney, Agent, or Firm* — Cha & Reiter, LLC

(57) ABSTRACT

According to certain embodiments, an electronic device comprises a first electrical structure disposed in an internal space of the electronic device; and a flexible printed circuit board (FPCB) comprising a first fastening area and an extension area extended from the first fastening area, the first fastening area electrically connected to the first electrical structure, wherein the FPCB further comprises: a dielectric substrate comprising a first surface and a second surface facing in a direction opposite to that of the first surface and facing the first electrical structure; a first conductive layer disposed on the first surface of the dielectric substrate; and a first protective layer stacked on the first conductive layer, in the extension area and terminating in the first fastening area; wherein the first fastening area comprises a screw through hole for screw fastening, and at least one conductive via disposed at a periphery of the screw through hole extending from the dielectric substrate to the first conductive layer.

16 Claims, 11 Drawing Sheets

(51) Int. Cl.
 *H05K 7/14* (2006.01)
 *H05K 1/11* (2006.01)
(58) Field of Classification Search
 CPC ......... H05K 1/144–147; H05K 7/1407; H05K 7/1422; H05K 2201/10409; H05K 2201/10189
 USPC ........ 361/679, 749–752, 775–778, 792–795, 361/803, 816, 818, 814; 174/254–268
 See application file for complete search history.

(56) References Cited

U.S. PATENT DOCUMENTS

| | | | |
|---|---|---|---|
| 8,212,154 B2 * | 7/2012 | Kashiwakura | H05K 1/0251 174/262 |
| 8,380,080 B2 * | 2/2013 | Kawaguchi | H05K 1/0234 398/164 |
| 9,894,767 B1 * | 2/2018 | Krugman | H05K 1/115 |
| 2005/0286238 A1 | 12/2005 | Joy | |
| 2007/0031091 A1 * | 2/2007 | Mitamura | H05K 1/0243 385/88 |
| 2007/0124930 A1 | 6/2007 | Cheng et al. | |
| 2008/0085747 A1 | 4/2008 | Lee | |
| 2014/0125426 A1 | 5/2014 | Kato et al. | |
| 2015/0211718 A1 * | 7/2015 | Diekmann | H05K 1/115 362/382 |
| 2017/0171960 A1 * | 6/2017 | Yang | H04M 1/0277 |

\* cited by examiner

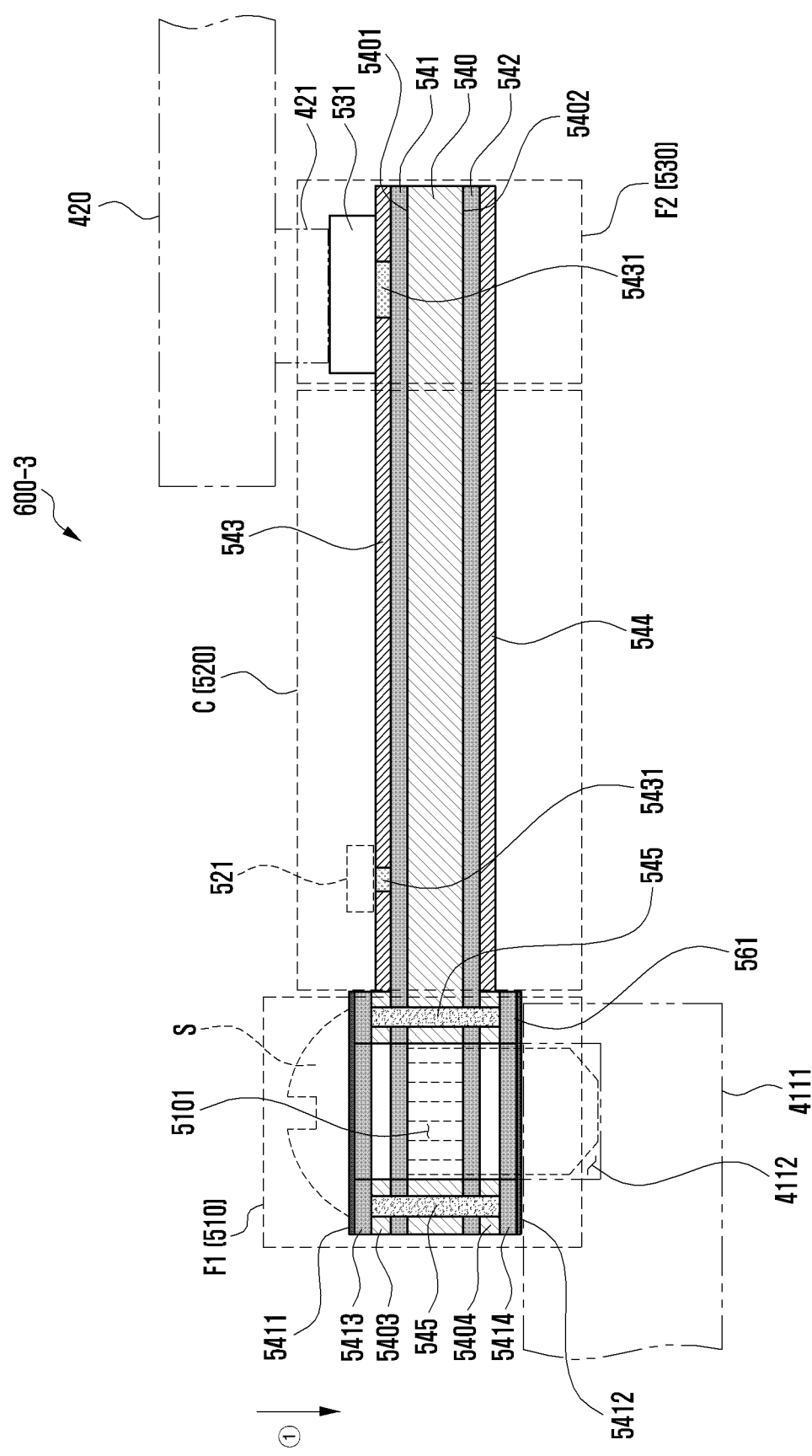

ELECTRICAL CONNECTING DEVICE AND ELECTRONIC DEVICE INCLUDING THE SAME

CROSS-REFERENCE TO RELATED APPLICATION(S)

This application is based on and claims priority under 35 U.S.C. 119 to Korean Patent Application No. 10-2019-0059620, filed on May 21, 2019, in the Korean Intellectual Property Office, the disclosures of which are herein incorporated by reference in their entireties.

TECHNICAL FIELD

Certain embodiments of the disclosure relate to an electrical connection device and an electronic device including the same.

BACKGROUND

Electronic devices may provide many different function in addition to phone calls. To that end, electronic device includes a number of different electrical structures. Electronic structures provided in the electronic device may be disposed apart from each other in the electronic device. Such a separated disposition may be a factor in prevention performance degradation from noise between electronic structures.

SUMMARY

According to certain embodiments, an electronic device comprises a first electrical structure disposed in an internal space of the electronic device; and a flexible printed circuit board (FPCB) comprising a first fastening area and an extension area extended from the first fastening area, the first fastening area electrically connected to the first electrical structure, wherein the FPCB further comprises: a dielectric substrate comprising a first surface and a second surface facing in a direction opposite to that of the first surface and facing the first electrical structure; a first conductive layer disposed on the first surface of the dielectric substrate; and a first protective layer stacked on the first conductive layer, in the extension area and terminating in the first fastening area; wherein the first fastening area comprises a screw through hole for screw fastening, and at least one conductive via disposed at a periphery of the screw through hole extending from the dielectric substrate to the first conductive layer.

According to certain embodiments, an electronic device comprises a first electrical structure disposed in an internal space of the electronic device; a second electrical structure spaced apart from the first electrical structure; a flexible printed circuit board (FPCB) comprising a first fastening area electrically connected to the first electrical structure through screw fastening, an extension area extended from the first fastening area, and a second fastening area extended from the extension area and electrically connected to the second electrical structure, wherein the FPCB comprises: a dielectric substrate comprising a first surface and a second surface facing in a direction opposite to that of the first surface and facing the first electrical structure; a first conductive layer disposed at the first surface of the dielectric substrate; a first protective layer stacked on the first conductive layer in the extension area; a second conductive layer disposed at the second surface of the dielectric substrate; and a second protective layer stacked on the second conductive layer, in the extension area; wherein in the first fastening area, the first conductive layer and the second conductive layer are electrically connected to the first electrical structure; a screw through hole for screw fastening in the first fastening area; and at least one conductive via disposed at a periphery of the screw through hole and formed from the first conductive layer to the second conductive layer through the dielectric substrate in the first fastening area.

BRIEF DESCRIPTION OF THE DRAWINGS

In the drawings, the same or similar reference numerals may be used for the same or similar components.

FIG. 6A, FIG. 6B and FIG. 6C are cross-sectional views illustrating electrical connection devices according to certain embodiments of the disclosure.

DETAILED DESCRIPTION

For an electrical connection between electric structures, a separate electrical connection device can be provided, and the electrical connection device may require a reliable electrical connection structure for use of the electrical device for long periods of time, which is both durable and provides a good shield against noise.

The electronic device may have a configuration in which individual electronic components spaced apart from each other are electrically connected to each other. In this case, the separated first electronic component and second electronic component may be electrically connected by an electrical connection device. For example, the electrical connection device may include a predetermined length of flexible printed circuit board (FPCB) (e.g., flexible printed circuit board or flexible circuit board). An electrical connector (e.g., plug) installed at one end of the FPCB may be connected to an electronic component such as a printed circuit board and the FPCB is fastened through a screw to an electrical structure such as an antenna radiator through a screw fastening portion disposed at the other end thereof; thus the FPCB may electrically connect the antenna radiator and the printed circuit board. In this case, the fastening portion for fastening the screw of the FPCB is a metal member and may be fastened separately to the FPCB.

However, if the fastening portion is separately provided in the FPCB, a production times and costs increase. Moreover, and a limitation may occur in the surface mount technology (SMT) process by a pulling phenomenon due to a weight of the fastening portion. Further, when the fastening portion is applied as nickel-plated SUS, the fastening portion may cause performance degradation of the electronic component by corrosion.

Certain embodiments of the disclosure may provide an electrical connection device and an electronic device including the same.

Certain embodiments of the disclosure may provide an electrical connection device and an electronic device including the same in which the production process is simpler and costs can be reduced.

Certain embodiments of the disclosure may provide an electrical connection device and an electronic device including the same, which ensure reliability of the device over long periods of use.

FIGS. 1 through 7, discussed below, and the various example embodiments used to describe the principles of the present disclosure in this disclosure are by way of illustration only and should not be understood in any way to limit the scope of the disclosure. Those skilled in the art will understand that the principles of the present disclosure may be implemented in any suitably arranged system or device.

Hereinafter, various example embodiments of the present disclosure are described in greater detail with reference to the accompanying drawings.

Figure 1:
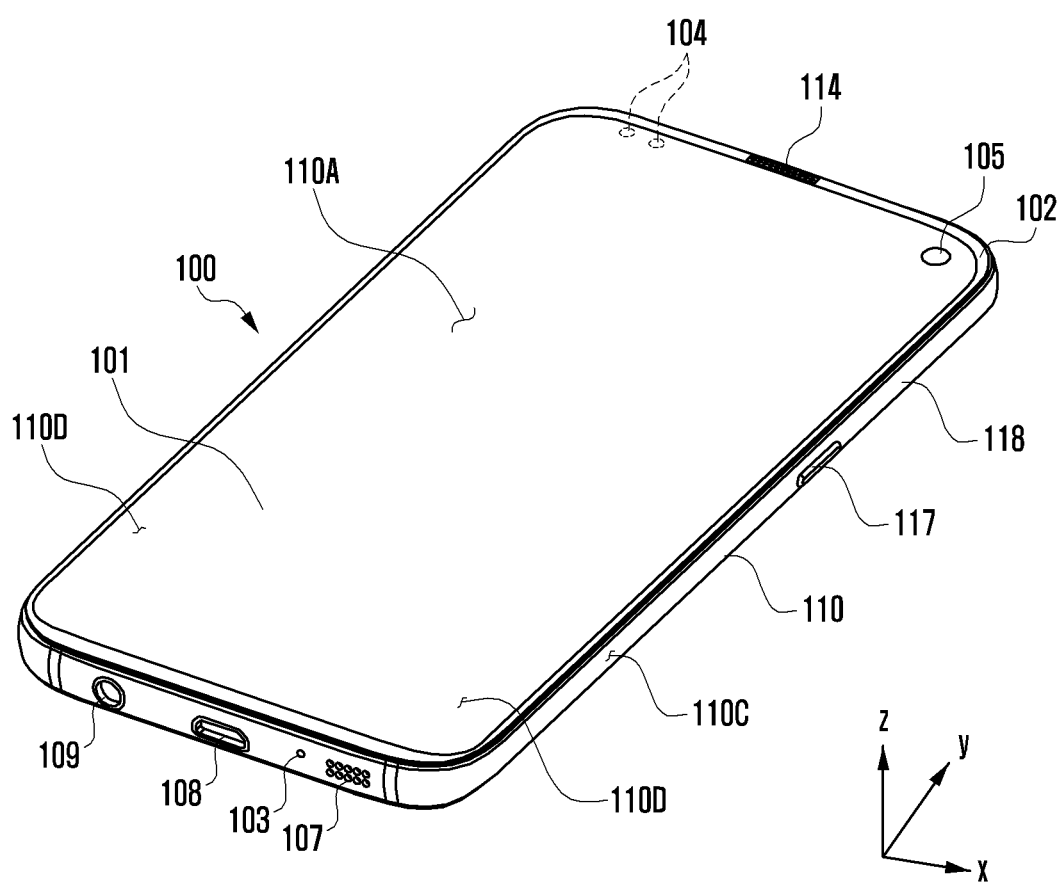
FIG. 1 is a perspective view illustrating a front surface of a mobile electronic device according to certain embodiments of the disclosure.
Figure 2:
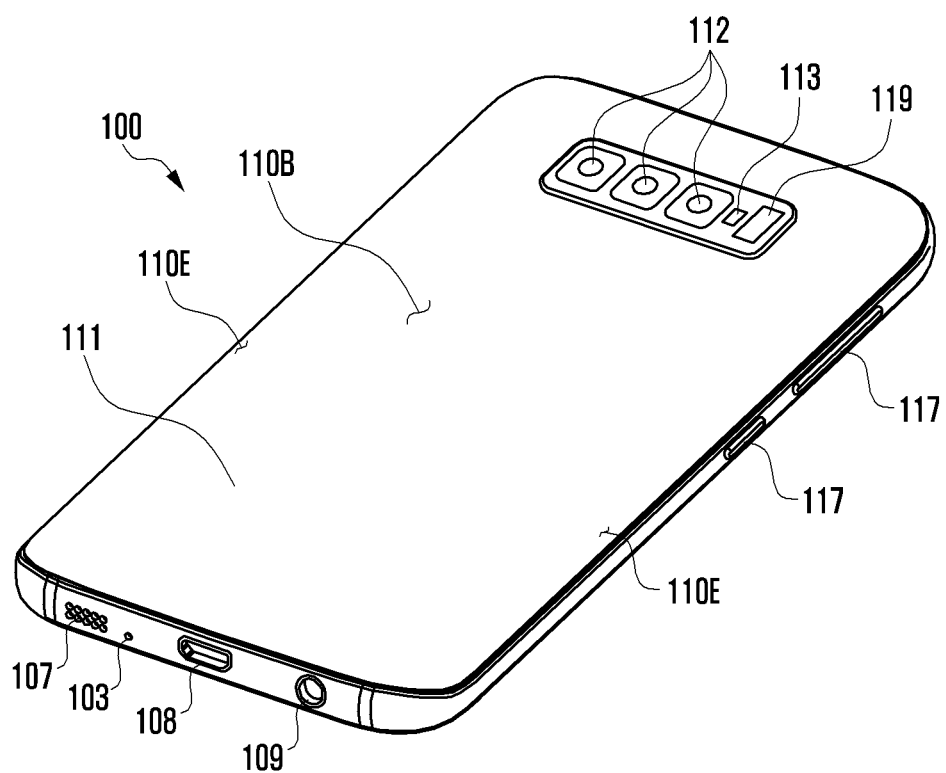
FIG. 2 is a perspective view illustrating a rear side of the electronic device of FIG. 1 according to certain embodiments of the disclosure.

FIG. 1 is a front a perspective view illustrating a front surface of an example mobile electronic device 100 according to an embodiment, and FIG. 2 is a rear perspective view illustrating a rear surface of the mobile electronic device 100 shown in FIG. 1.

Referring to FIGS. 1 and 2, the mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104, 116 and 119, camera modules 105, 112 and 113, a key input device 117, a light emitting device, and connector holes 108 and 109. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device. At least one of the audio module 114, the sensor module 104, the camera module 105, the fingerprint sensor 116, and the light emitting element may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104, 116 and 119 may generate electrical signals or data corresponding to an internal operating state of the mobile electronic device 100 or to an external environmental condition. The sensor modules 104, 116 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module 116 (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module 116 disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
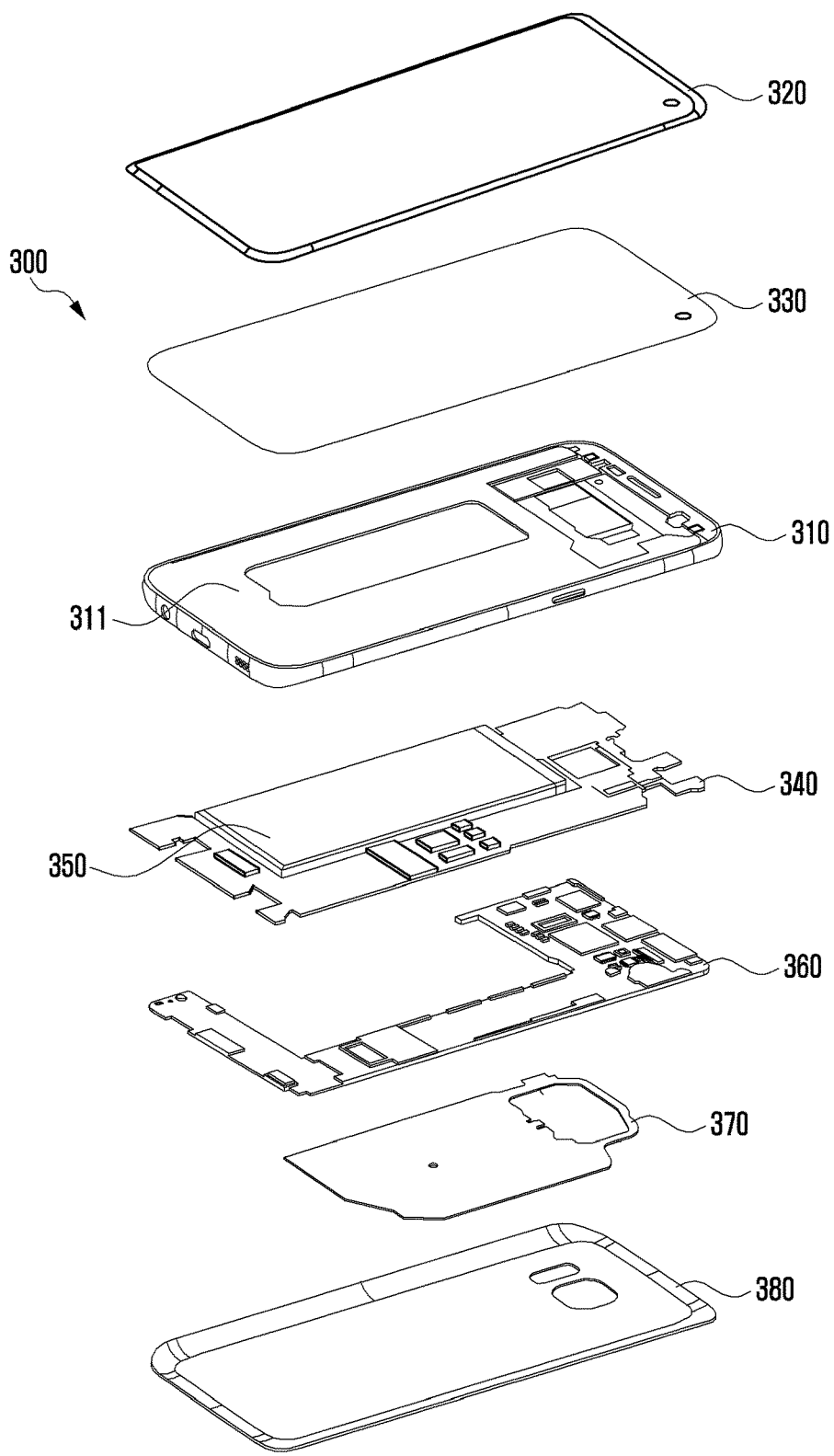
FIG. 3 is an exploded perspective view illustrating the electronic device of FIG. 1 according to certain embodiments of the disclosure.

FIG. 3 illustrates an exploded perspective view showing a mobile electronic device 300 shown in FIG. 1.

Referring to FIG. 3, the mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the PCB 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

The electronic device 400 can include a plurality of discrete electrical components that are spaced apart from one another. An electrical connection device 500 can establish an electrical connection between a first electrical component and a second electrical components. In one embodiment, the first electrical component can be a printed circuit board and the second electrical component can conductive material (a conductive portion) used as an antenna.

Figure 4:
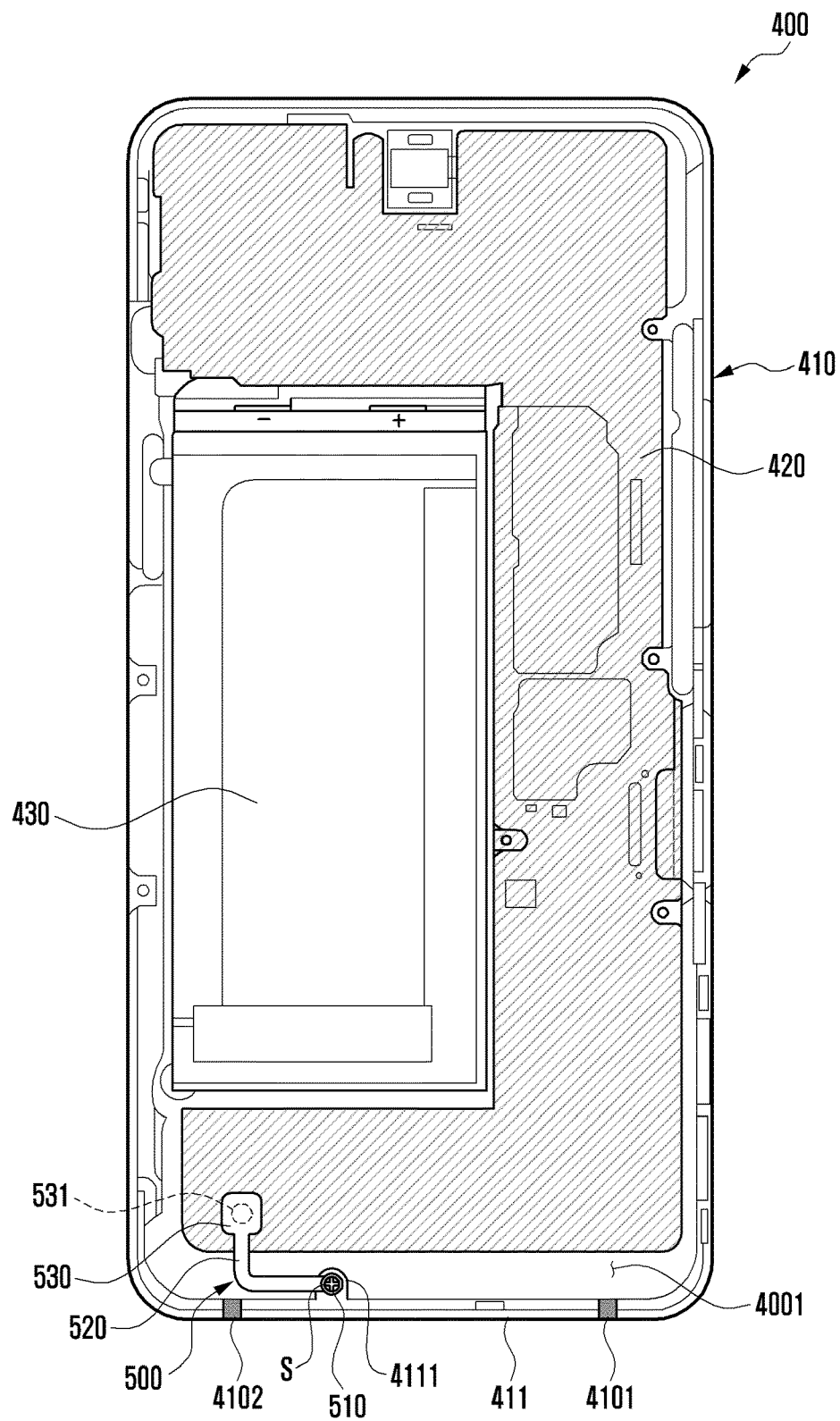
FIG. 4 is a diagram illustrating an electronic device to which an electrical connection device is applied according to certain embodiments of the disclosure.

FIG. 4 is a diagram illustrating an electronic device 400 including an electrical connection device 500 applied therein, according to certain embodiments of the disclosure.

The electronic device 400 of FIG. 4 may be at least partially similar to the electronic device 100 of FIGS. 1 and 2 or the electronic device 300 of FIG. 3 or may include other components of the electronic device.

In one embodiment, the electrical connection device 500 electrically connects a printed circuit board 420 and a conductive portion 411 used as an antenna, but the disclosure is not limited thereto. For example, the electrical connection device 500 may be used for electrical connection of other electronic components disposed inside the electronic device.

With reference to FIG. 4, the electronic device 400 may include a plurality of electronic components (e.g., electrical structures) disposed in an internal space 4001 formed at least partially in a side member 410. According to one embodiment, the plurality of electronic components may include a printed circuit board 420 and conductive portion 411 insulated from a peripheral conductive side member through a pair of non-conductive portions 4101 and 4102 disposed separately in at least some areas of the conductive side member 410. The conductive portion 411 may be used as an antenna operating in a specific frequency band through a wireless communication circuit disposed at the printed circuit board 420.

The electronic device 400 may include an electrical connection device 500 electrically connecting the printed circuit board 420 to the conductive portion 411, wherein the conductive portion 411 is spaced apart from the printed circuit board 420. The electrical connection device 500 may include an FPCB. The electrical connection device 500 may include a first fastening portion 510, an extension portion 520, and a second fastening portion 530. The first fastening portion 510 can be extended from the conductive portion 411 near the conductive portion 411 and fastened to a conductive bushing 4111 and include a screw fastener (e.g., a screw fastener 4112 of FIG. 5C) through a screw S. The extension portion 520 can extend from the first fastening portion 510 to the printed circuit board 420. The second fastening portion 530 can extend from the extension portion 520 and be electrically connected to the printed circuit board 420 through the electrical connector 531. According to one embodiment, the conductive bushing may be integrally formed with the conductive portion 411.

Since a conductive layer of the FPCB is at least partially exposed electrically, the electrical connection device 500 according to an embodiment of the disclosure including a first fastening portion 510 used for screw fastening alleviates constraints from automatic SMT, thereby simplifying the production process and cost.

Hereinafter, the electrical connection device 500 according to an exemplary embodiment of the disclosure will be described in detail.

Figure 5A:
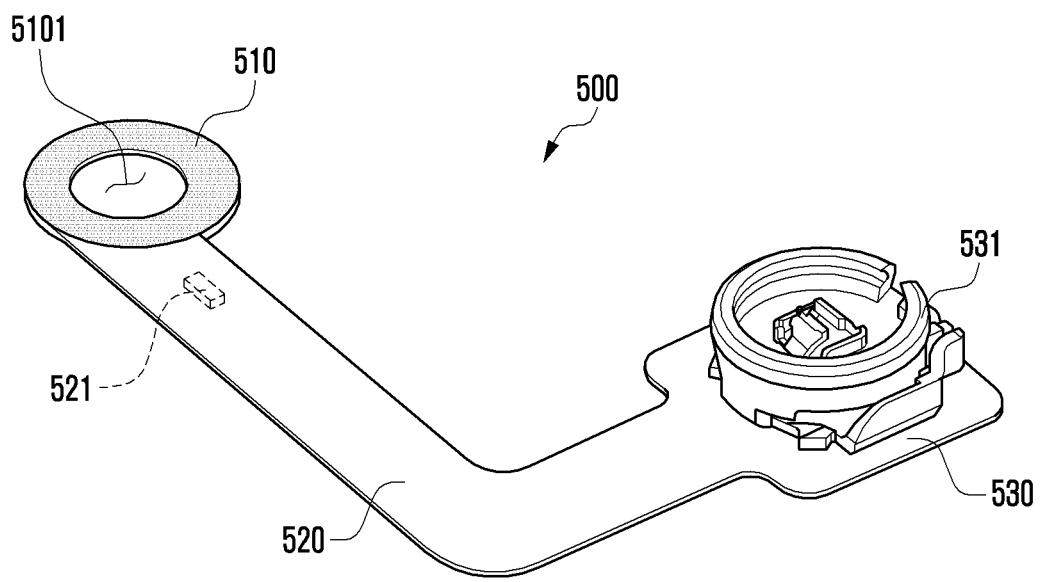
FIG. 5A is a perspective view illustrating an electrical connection device according to certain embodiments of the disclosure.
Figure 5B:
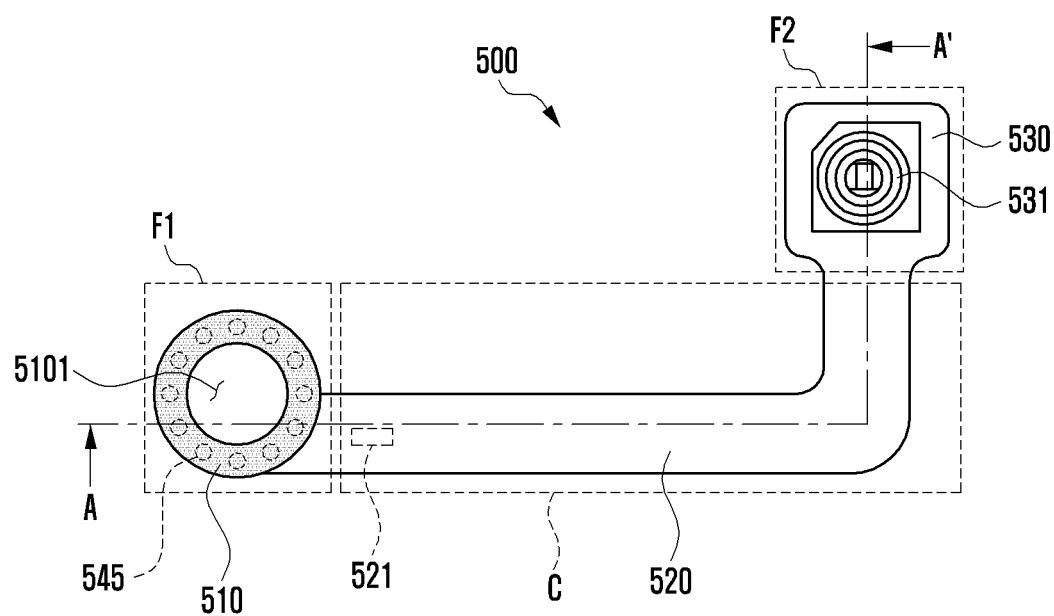
FIG. 5B is a plan view illustrating an electrical connection device according to certain embodiments of the disclosure.

FIG. 5A is a perspective view illustrating an electrical connection device 500 according to certain embodiments of the disclosure. FIG. 5B is a plan view illustrating an electrical connection device 500 according to certain embodiments of the disclosure.

With reference to FIGS. 5A and 5B, the electrical connection device 500 may include a first fastening area F1, which can be an FPCB, an extension area C extended from the first fastening area F1, and a second fastening area F2 extended from the extension area C. As described above, the electrical connection device 500 may include a first fastening portion 510 corresponding to the first fastening area F1, an extension portion 520 corresponding to the extension area C, and a second fastening portion 530 corresponding to the second fastening area F2.

Figure 5C:
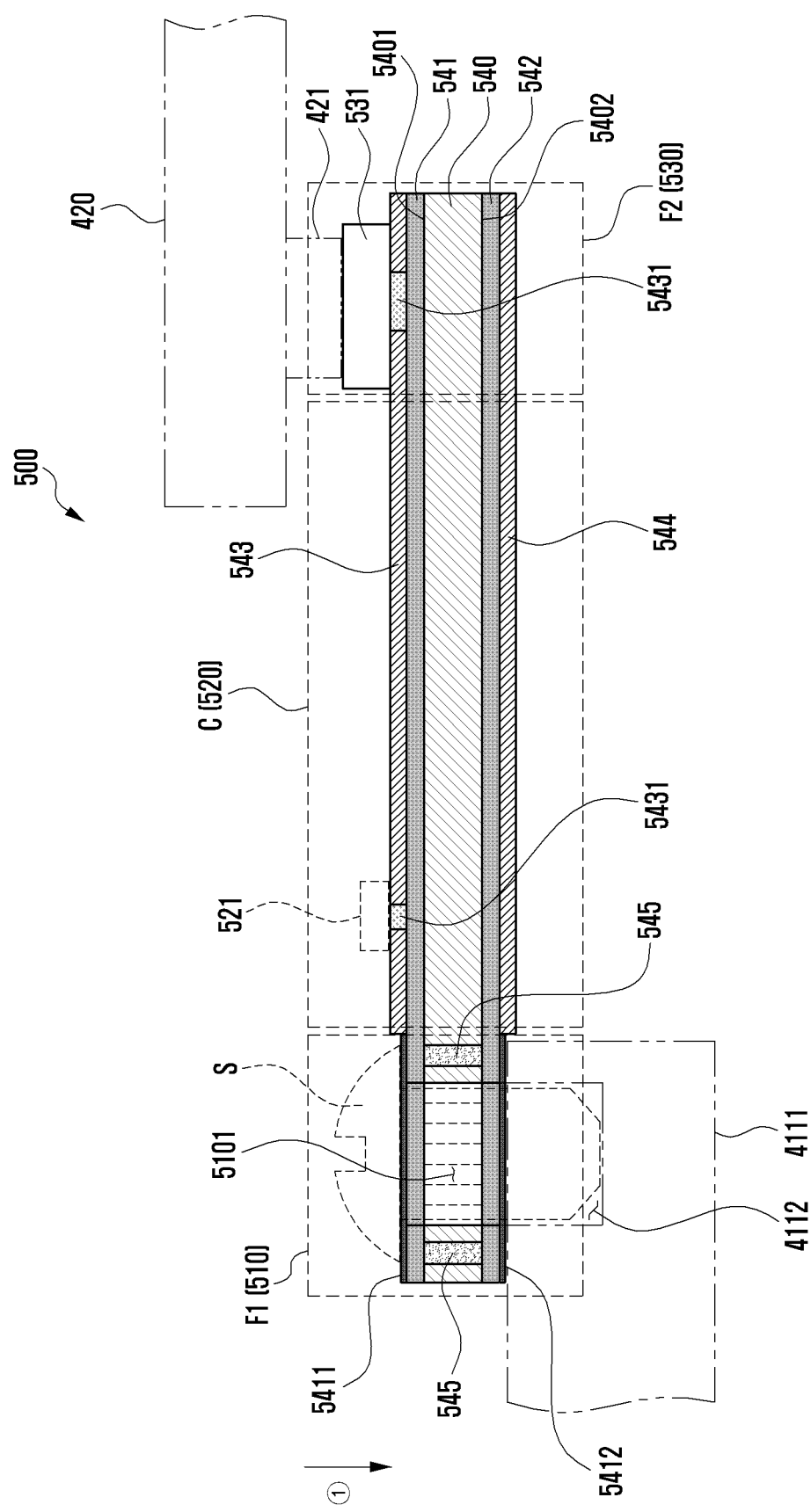
FIG. 5C is a cross-sectional view illustrating the electrical connection device viewed from line A-A' of FIG. 5B according to certain embodiments of the disclosure.

The first fastening portion 510 may include at least one conductive layer (e.g., a first conductive layer 541 and a second conductive layer 542 of FIG. 5C) exposed electrically from the FPCB, such that the conductive layer 541 or 542 can make electrical contact with an external structure. The first fastening portion 510 may include a screw through hole 5101 formed in the exposed conductive layer. According to one embodiment, the first fastening portion 510 may be electrically connected by being fixed to an electronic component (e.g., the conductive portion 411 of FIG. 4) through a screw (e.g., the screw S of FIG. 4) penetrated through the screw through hole 5101. According to one embodiment, the first fastening portion 510 may include at least one conductive via 545 disposed at a uniform interval or a not-uniform interval along a periphery of the screw through hole 5101 to help to reinforce rigidity of the first fastening portion 510. According to one embodiment, the at least one conductive via 545 may also help an electrical connection to the exposed conductive layer of the first fastening portion 510 and the electronic components (e.g., the printed circuit board 420 and/or the conductive portion 411).

According to certain embodiments, the extension portion 520 may be formed in various lengths and/or various shapes according to a separation distance and/or a disposition location between two electronic components (e.g., the printed circuit board 420 and the conductive portion 411 of FIG. 4). According to an embodiment, the extension portion 520 may be formed in a straight line, an L shape, or an S shape. According to an embodiment, the extension portion 520 may be formed so that at least one conductive layer 541 and 542 are insulated by a protective layer (e.g., a first protective layer 543 and a second protective layer 544 of FIG. 5C).

According to one embodiment, the extension portion 520 may include at least one electrical element 521 at least partially mounted and electrically connected to the conductive layer. According to one embodiment, the electrical element 521 may include at least one matching circuit for improving a radiation performance of the conductive portion 411 used as an antenna. The electrical element 521 may include a passive element. For example, in the electrical connection device 500 in which the first fastening portion 510 is integrally formed with the FPCB, the electrical element 521 is disposed relatively closer to the conductive portion 411 near the first fastening portion 510, thereby helping improve an antenna radiation performance.

In certain embodiments, the conductive portion 521 is configured to radiate a signal and receive a radio signal. The electrical element 521 perform baseband processing, modulation, and demodulation, such that the printed circuit board 420 provides and receives signal in the baseband.

According to certain embodiments, the second fastening portion 530 may include an electrical connector 531 for fastening to an electronic component (e.g., the printed circuit board 420 of FIG. 4). The electrical connector 531 may be fastened to a receptacle mounted in an electronic component. In another embodiment, the electrical connector 531 may include a male connector fastened to a female connector mounted in the electronic component. In another embodiment, when screw fastening to an electronic component is required, the second fastening portion 530 may be formed to have substantially the same configuration as that of the first fastening portion 510.

FIG. 5C is a cross-sectional view illustrating the electrical connection device 500 viewed from line A-A' of FIG. 5B according to certain embodiments of the disclosure.

With reference to FIG. 5C, the electrical connection device 500 may include a flexible copper clad laminate (FCCL) or a copper clad laminate (CCL) (e.g., dielectric and copper clad laminate). According to an embodiment, the electrical connection device 500 may include a dielectric substrate 540, a first conductive layer 541 stacked on a first surface 5401 of the dielectric substrate 540, and a second conductive layer 542 stacked on a second surface 5402 facing in a direction opposite to that of the first surface 5401. The electrical connection device 500 may include a first protective layer 543 at least partially stacked on the first conductive layer 541 and a second protective layer 544 at least partially stacked on the second conductive layer 542. According to an embodiment, the first conductive layer 541 and/or the second conductive layer 542 may include a conductive pattern for electrically connecting electronic components (e.g., the conductive portion 411 and the printed circuit board 420). According to an embodiment, the first conductive layer 541 and/or the second conductive layer 542 may include a ground layer. According to an embodiment, the first conductive layer 541 and the second conductive layer 542 may include Cu disposed on the dielectric substrate 540. According to an embodiment, the first protective layer 543 and the second protective layer 544 may include a photo-solder resist (PSR) layer and/or a coverlay.

The first fastening area F1 of the electrical connection device 500 may be formed in a conductive exposed area in which the first conductive layer 541 and the second protective layer 542 are electrically exposed, (the first protective layer 543 and the second protective layer 544 can terminate at the edge of the extended area C or fastening area F1). For example, as the conductive screw S is fastened through the conductive exposed area, the conductive layers 541 and 542 and the conductive portion (e.g., the conductive portion 411 of FIG. 4) of the electronic device (e.g., the electronic device 400 of FIG. 4) may be electrically connected. According to an embodiment, the first fastening area F1 may further include additional plating layers 5411 and 5412 formed on the first conductive layer 541 and the second conductive layer 542 exposed to the outside. According to one embodiment, the additional plating layers 5411 and 5412 may include a gold plating layer for corrosion prevention and excellent electrical connection.

According to certain embodiments, the first fastening area F1 may include a screw through hole 5101 for screw fastening. According to one embodiment, the first fastening area F1 may include at least one conductive via 545 formed in a manner enclosing a periphery of the screw through hole 5101. According to one embodiment, the conductive via 545 may be used for reinforcement of rigidity that can withstand a screw fastening force. In another embodiment, the conductive via 545 penetrates through the dielectric substrate 540 and is formed in a manner contacting the first conductive layer 541 and the second conductive layer 542, thereby helping an electrical connection between the first conductive layer 541 and/or the second conductive layer 542 and the conductive portion (e.g., the conductive portion 411 of FIG. 4). According to an embodiment, the conductive vias 545 may be disposed at a uniform interval or a non-uniform interval along an edge of the screw through hole 5101.

In certain embodiments, the first conductive layer 541 and second conductive layer 542 may be formed over the screw through hole 5101, and are punctured by penetration of the screw S. In other embodiments, the conductive layer 541 and the second conductive layer 542 may have a hole above the screw through hole 5101 prior to penetration by the screw S.

According to certain embodiments, the extension area C may include at least one electrical element 521 connected to the first conductive layer 541. According to an embodiment, the electrical element 521 may be disposed on the first protective layer 543 and be electrically connected to the first conductive layer 541 through a conductive solder 5431 (e.g., pre-solder).

According to certain embodiments, the second fastening area F2 may include an electrical connector 531 mounted for connecting to a corresponding connector 421 (e.g., receptacle) of the printed circuit board 420 disposed inside the electronic device (e.g., the electronic device 400 of FIG. 4). According to an embodiment, the electrical connector 531 may also be electrically connected to the first conductive layer 541 through the conductive solder 5431 in the first protective layer 543.

According to certain embodiments, the conductive portion (e.g., the conductive portion 411 of FIG. 4) of the electronic device (e.g., the electronic device 400 of FIG. 4) may be electronically connected to the printed circuit board 420 through the electrical connection device 500. According to an embodiment, in the electrical connection device 500, in a state in which the first fastening portion 510 is placed on the conductive bushing 4111 extended from a conductive portion (e.g., the conductive portion 411 of FIG. 4) in a direction of an internal space (e.g., the internal space 4001 of FIG. 4), the screw S may be fastened in a screw fastening direction (direction ①). In this case, the screw S may penetrate the screw through hole 5101 of the first fastening portion 510 and then be fastened to a screw fastener 4112 provided in the conductive bushing 4111. In another embodiment, the first fastening portion 510 may be attached to the conductive bushing 4111 through at least one process of screw fastening, thermal fusion, ultrasonic fusion, or soldering. Accordingly, the conductive portion (e.g., the conductive portion 411 of FIG. 4) of the electronic device (e.g., the electronic device 400 of FIG. 4) may be electrically connected to the printed circuit board 420 through the conductive bushing 4111, the first conductive layer 541 of the first fastening portion 510, and connectors 531 and 421.

Figure 6A:
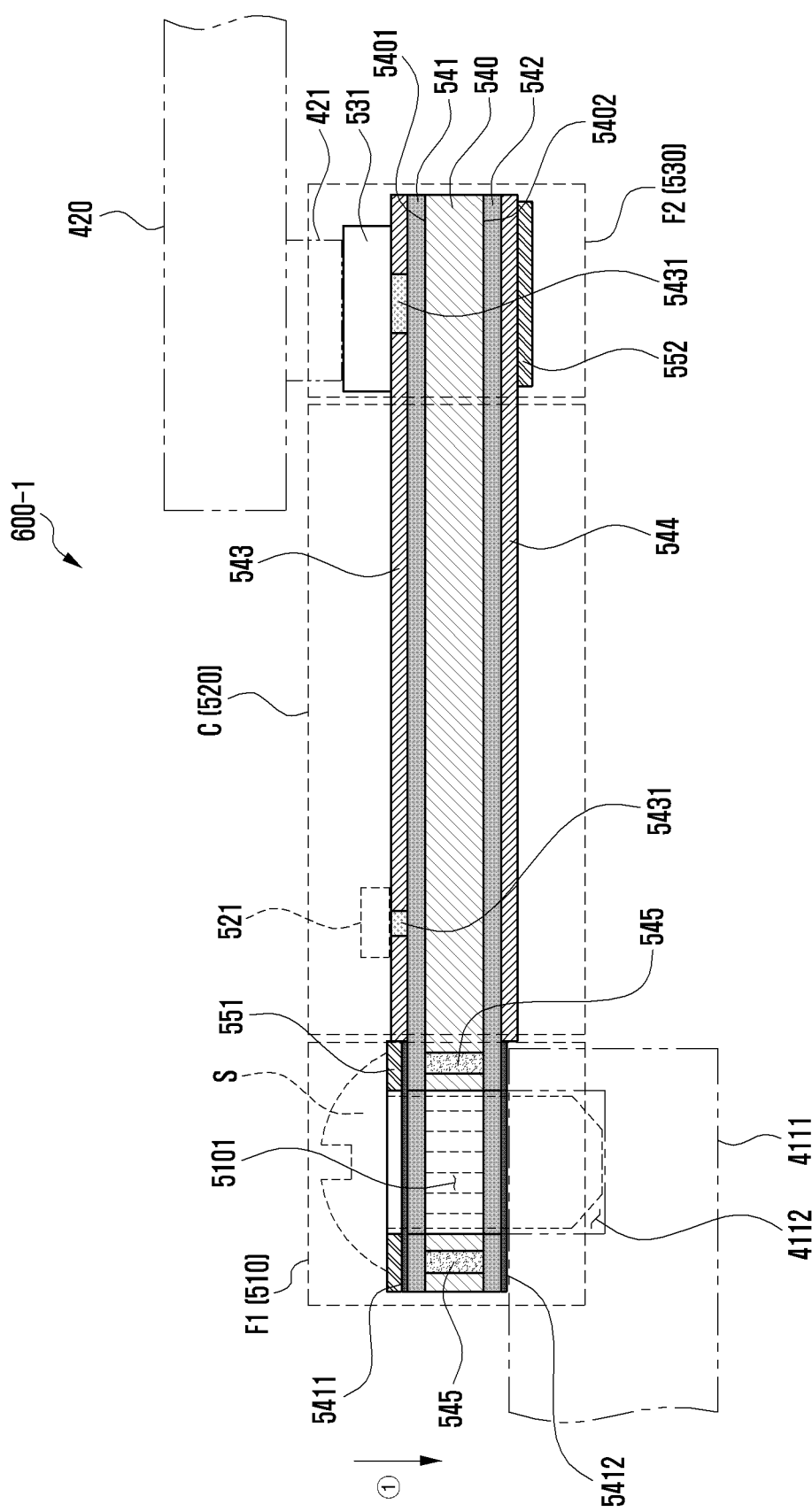
Figure 6B:
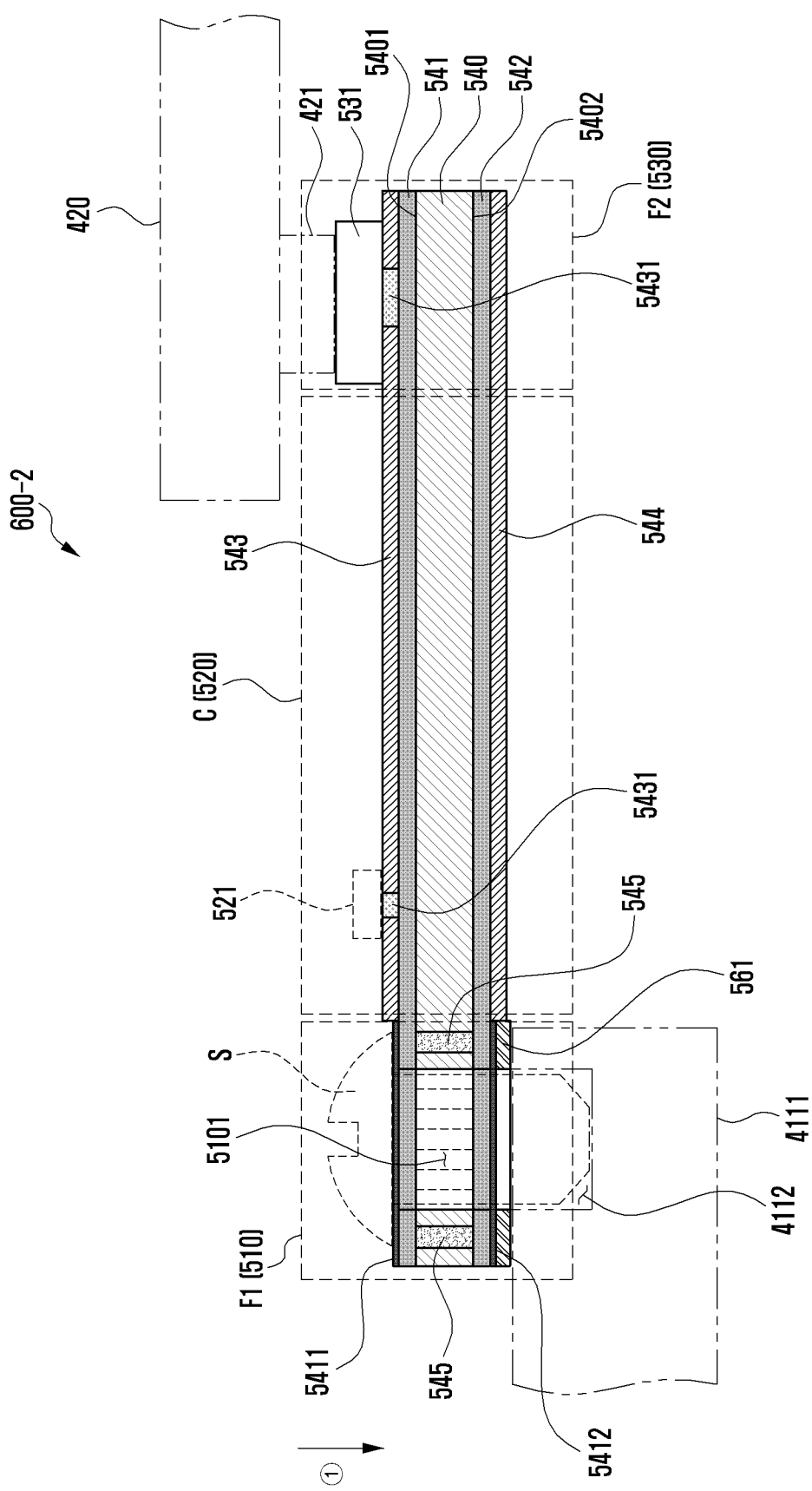

FIGS. 6A to 6C are cross-sectional views illustrating electrical connection devices 600-1, 600-2, and 600-3 according to certain embodiments of the disclosure.

When describing FIGS. 6A to 6C, the electrical connection devices 600-1, 600-2, and 600-3 may have substantially the same components as those of the electrical connection device 500 of FIG. 5C. Therefore, a detailed description of the same components may be omitted.

With reference to FIG. 6A, the electrical connection device 600-1 may further include a reinforcing member 551 stacked on the exposed first conductive layer 541 in the first fastening area F1. According to an embodiment, the reinforcing member 551 may be disposed in the first conductive layer 541 or the additional plating layer 5411 through at least one of a taping, bonding, soldering, or fusion process. According to an embodiment, the reinforcing member 551 may include a metal member such as Al, stainless-steel (SUS), or Cu. According to an embodiment, the reinforcing member 551 may include a polymer material such as polycarbonate (PC). Accordingly, the first fastening area F1 may help reinforcement of rigidity capable of withstanding a screw fastening force through the reinforcing member 551. In another embodiment, when the electrical connector 531 is fastened through the additional reinforcing member 552 disposed on the second protective layer 544, the second fastening area F2 may also assist rigidity reinforcement. In certain embodiments, the reinforcing member 551 may be disposed about the periphery of the screw through hole 5101.

With reference to FIG. 6B, the electrical connection device 600-2 may further include a conductive reinforcing member 561 stacked on the exposed first conductive layer 541 in the first fastening area F1. According to an embodiment, the conductive reinforcing member 561 may be disposed at the second conductive layer 542 or the additional plating layer 5412 through at least one of a taping, bonding, soldering, or fusion process. According to an embodiment, the conductive reinforcing member 551 may include a metal member having a predetermined thickness such as Al, SUS, or Cu.

With reference to FIG. 6C, the electrical connection device 600-3 may reinforce rigidity through addition of the dielectric substrate 540 and/or the conductive layers 5413 and 5414 in the first fastening area F1. The electrical connection device 600-3 may further include a first additional dielectric layer 5403 disposed at the exposed first conductive layer 541 and a second additional dielectric layer 5404 disposed at the second conductive layer 542. According to an embodiment, the first additional dielectric layer 5403 and the second additional dielectric layer 5404 may be made of an identical material or a non-identical dielectric material as that of the dielectric substrate 540. According to an embodiment, the electrical connection device 600-3 may include a third conductive layer 5413 stacked on the first additional dielectric layer 5403 and/or a fourth conductive layer 5414 stacked on the second additional dielectric layer 5404. According to an embodiment, the electrical connection device 600-3 may further include additional plating layers 5411 and 5412 disposed on the third conductive layer 5413 and/or the fourth conductive layer 5414. According to an embodiment, the third conductive layer 5413 and the fourth conductive layer 5414 may include Cu. According to one embodiment, the additional plating layers 5411 and 5412 may include a gold plating layer.

In certain embodiments, the first additional dielectric layer 5403 and second additional dielectric layer 5404 can be disposed to surround the periphery of screw through hole 5101. The first conductive layer 541, second conductive layer 542, third conductive layer 5413, and fourth conductive layer 5414 can cover the screw through hole 5101, and the screw S can puncture the first conductive layer 541, second conductive layer 542, third conductive layer 5413, and fourth conductive layer 5414 when penetrating. Accordingly, the first conductive layer 541, second conductive layer 542, third conductive layer 5413, and fourth conductive layer 5414 can have thickness, such that they can be punctured by a reasonable application of force to the screw. In certain embodiments, the first conductive layer 541 and third conductive layer 5413 can be separated by air, and the second conductive layer 542 and the fourth conductive layer 5414 can also be separated by air.

According to certain embodiments, after penetrating the dielectric substrate 540, the first conductive layer 541, the second conductive layer 542, the first additional dielectric layer 5403, and the second additional dielectric layer 5404, at least one conductive via 545 may be connected to the third conductive layer 5413 and the fourth conductive layer 5414; thus, the third conductive layer 5413 and the fourth conductive layer 5414 may be electrically connected through at least one conductive via 545. Accordingly, the first fastening portion F1 may have a thickness greater than that of other areas through the additional dielectric layers 5403 and 5404 to help reinforce rigidity capable of withstanding a screw fastening force. In another embodiment, in the first fastening portion F1, the first conductive layer 541 and the second conductive layer 542 may be omitted. In this case, the third conductive layer 5413 and the fourth conductive layer 5414 may be electrically connected to the first conductive layer 541 and the second conductive layer 542 of the extension area C through the conductive via 545.

Figure 7:
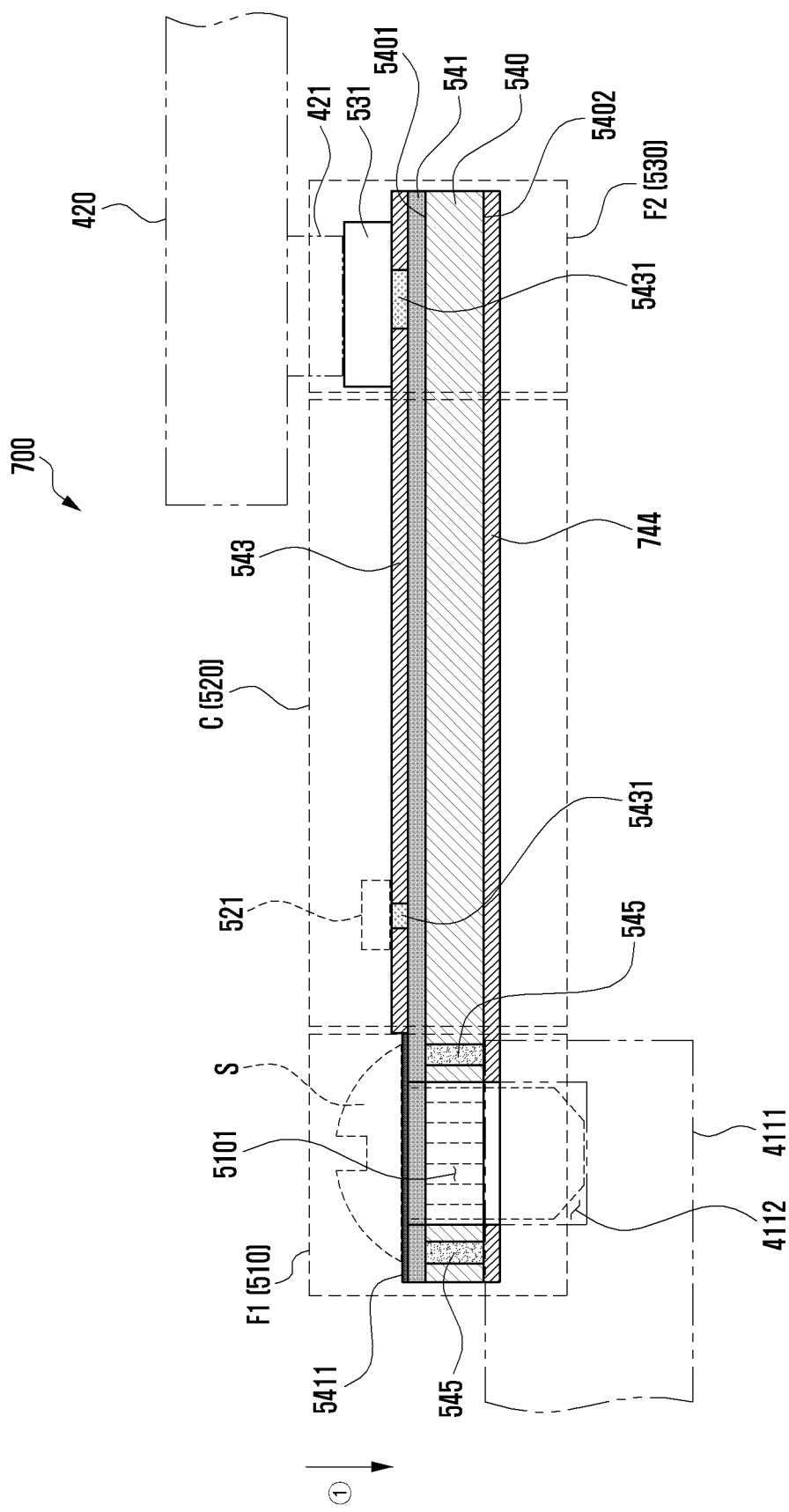
FIG. 7 is a cross-sectional view illustrating an electrical connection device according to certain embodiments of the disclosure.

FIG. 7 is a cross-sectional view illustrating an electrical connection device 700 according to certain embodiments of the disclosure.

When describing FIG. 7, the electrical connection device 700 may have substantially the same components as those of the electrical connection device 500 of FIG. 5C. Therefore, a detailed description of the same components may be omitted.

With reference to FIG. 7, unlike the foregoing description, the electrical connection device 700 may include a single layer FPCB including one conductive layer 541 disposed on a dielectric substrate 540. In this case, the second conductive layer (e.g., the second conductive layer 542 of FIG. 5C) may be omitted and include a protective layer 544 (e.g., coverlay) disposed on the dielectric substrate 540. According to an embodiment, the protective layer 544 may be extended to a first fastening area F1. In this case, the electrical connection device 700 may be electrically connected to the conductive bushing 4111 through a conductive screw S fastened to the first conductive layer 541 and an additional plating layer 5411.

According to certain embodiments, the electrical connection device 700 may include one conductive layer 541 or two conductive layers 541 and 542 with the dielectric substrate 540 interposed therebetween, but may include a multilayer dielectric substrate and include a multilayer FPCB including a plurality of conductive layers therebetween.

In the electrical connection device according to the embodiments of the disclosure, upon configuring the FPCB, in some areas, because the fastening portion for screw fastening is configured together, the production cost is reduced and design freedom for the FPCB is secured; thus, various shapes of fastening portions are applied to an automatic SMT process and a production process can be thus simplified, and by using the conductive layer of the FPCB at the fastening portion, reliability of the device can be secured even for long use.

According to certain embodiments, an electronic device (e.g., the electronic device 400 of FIG. 4), includes a first electrical structure (e.g., the conductive portion 411 of FIG. 4) disposed in an internal space of the electronic device (e.g., an internal space of the electronic device 400 of FIG. 4); and a flexible printed circuit board (FPCB) (e.g., the electronic connection device 500 of FIG. 5C) comprising a first fastening area (e.g., the first fastening area F1 of FIG. 5C) and an extension area extended from the first fastening area (e.g., the extension area C of FIG. 5C), the first fastening area electrically connected to the first electrical structure, wherein the FPCB further comprises a dielectric substrate (e.g., dielectric substrate 540 of FIG. 5C) comprising a first surface (e.g., the first surface 5401 of FIG. 5C) and a second surface (e.g., the second surface 5402 of FIG. 5C) facing in a direction opposite to that of the first surface and facing the first electrical structure; a first conductive layer (e.g., the first conductive layer 541 of FIG. 5C) disposed on the first surface of the dielectric substrate; and a first protective layer (e.g., the first protective layer 543 of FIG. 5C) stacked on the first conductive layer, in the extension area and terminating in the first fastening area; wherein in the first fastening area, the first conductive layer makes electrical contact with the first electrical structure, wherein the first fastening area comprises a screw through hole (e.g., the screw through hole 5101 of FIG. 5C) for screw fastening, and at least one conductive via (e.g., the conductive via 545 of FIG. 5C) disposed at a periphery of the screw through hole extending from the dielectric substrate to the first conductive layer.

According to certain embodiments, a plating layer (e.g., the additional plating layer 5411 of FIG. 5C) is stacked on the first conductive layer in the first fastening area.

According to certain embodiments, the plating layer comprises gold.

According to certain embodiments, a reinforcing member (e.g., the reinforcing member 551 of FIG. 6A) is stacked on the first conductive layer in the first fastening area.

According to certain embodiments, the reinforcing member is made of at least one material of stainless steel (SUS), Al, or Cu.

According to certain embodiments, the reinforcing member comprises polymer material.

According to certain embodiments, a second conductive layer (e.g., the second conductive layer 542 of FIG. 5C) is disposed on the second surface (e.g., the second surface 5402 of FIG. 5C) of the dielectric substrate and a second protective layer (e.g., the second protective layer 544 of FIG. 5C) is disposed on the second conductive layer, extending in the extended area and terminating in the first fastening area.

According to certain embodiments, a reinforcing member (e.g., the reinforcing member 561 of FIG. 6B) is stacked on the second conductive layer in the first fastening area.

According to certain embodiments, the reinforcing member comprises a polymer material.

According to certain embodiments, the first electrical structure may include at least a conductive portion (e.g., the conductive portion 411 of FIG. 4) disposed between a pair of non-conductive portions (e.g., the non-conductive portions 4101 and 4102 of FIG. 4) in the side member, and the conductive portion may be configured to radiate a signal of the electronic device.

According to certain embodiments, the first electrical structure comprises at least a portion (e.g., the conductive portion 411 of FIG. 4) of a side member at least partially exposed to the exterior of the electronic device.

According to certain embodiments, the conductive portion comprises a conductive bushing (e.g., the conductive bushing 4111 of FIG. 5C) extended to the internal space of the electronic device and comprising a screw fastener (e.g., the screw fastener 4112 of FIG. 5C), and the first fastening area of the FPCB is fastened to the conductive bushing through a screw.

According to certain embodiments, in the first fastening area, a first additional dielectric layer (e.g., the first additional dielectric layer 5403 of FIG. 6C) is stacked on the first conductive layer, and a second conductive layer (e.g., the third conductive layer 5413) is disposed on the first dielectric layer.

According to certain embodiments, a second fastening area (e.g., the second fastening area F2 of FIG. 5C) is extended from the extension area and electrically connected to a second electrical structure disposed in the internal space of the electronic device.

According to certain embodiments, an electrical connector (e.g., the electrical connector 531 of FIG. 5C) is electrically connected to the first conductive layer and connected to a connector of the second electrical structure in the second fastening area.

According to certain embodiments, the second electrical structure comprises a printed circuit board disposed in the internal space of the electronic device.

According to certain embodiment, an electronic device includes a first electrical structure (e.g., the conductive portion 411 of FIG. 4) disposed in an internal space (e.g., an internal space of the electronic device 400 of FIG. 4) of the electronic device; a second electrical structure (conductive portion 411 of FIG. 4) spaced apart from the first electrical structure; a flexible printed circuit board (FPCB) (e.g., the electronic connection device 500 of FIG. 5C) comprising a first fastening area (e.g., the first fastening area F1 of FIG. 5C) electrically connected to the first electrical structure through screw fastening (e.g., the screw s of FIG. 4), an extension area (e.g., the extension area C of FIG. 5C) extended from the first fastening area, and a second fastening area (e.g., the second fastening area F2 of FIG. 5C) extended from the extension area and electrically connected to the second electrical structure, wherein the FPCB comprises a dielectric substrate (e.g., the dielectric substrate 540 of FIG. 5C) comprising a first surface (e.g., first surface 5401 of FIG. 5C) and a second surface (e.g., second surface 5402 of FIG. 5C) facing in a direction opposite to that of the first surface and facing the first electrical structure; a first conductive layer (e.g., the first conductive layer 541 of FIG. 5C) disposed at the first surface of the dielectric substrate; a first protective layer (e.g., the first protective layer 543 of FIG. 5C) stacked on the first conductive layer in the extension area; a second conductive layer (e.g., the second conductive layer 544) disposed at the second surface of the dielectric substrate; and a second protective layer (e.g., second protective layer 544 of FIG. 5C) stacked on the second conductive layer, in the extension area; wherein in the first fastening area, the first conductive layer and the second conductive layer are electrically connected to the first electrical structure; a screw through hole for screw fastening (screw hole 5101) in the first fastening area; and at least one conductive via (conductive via 545 of FIG. 5C) disposed at a periphery of the screw through hole and formed from the first conductive layer to the second conductive layer through the dielectric substrate in the first fastening area.

According to certain embodiments, the at least one conductive via is disposed to enclose along an edge of the screw through hole.

According to certain embodiments, the first electrical structure comprises a conductive portion (conductive portion 411 of FIG. 5C) configured to radiate a signal of the electronic device and disposed as at least a portion of a conductive side member.

According to certain embodiments, the second structure comprises a printed circuit board comprising a wireless communication circuit, and the wireless communication circuit is configured to transmit and receive wireless signals of a specific frequency band through a conductive portion electrically connected by the FPCB.

The embodiments of the disclosure disclosed in this specification and drawings only present a specific example in order to easily describe the technical contents according to an embodiment of the disclosure and to help an understanding of the embodiments of the disclosure, and they do not intend to limit the scope of the embodiments of the disclosure. Accordingly, all changes or modifications derived from the technical idea of certain embodiments of the disclosure in addition to the embodiments described herein should be construed as being included in the scope of certain embodiments of the disclosure without departing from the scope of the disclosure.

What is claimed is:

1. An electronic device, comprising:
   a conductive portion disposed between a pair of separated non-conductive portions in at least a portion of a side member at least partially exposed to an exterior of the electronic device, wherein the conductive portion is configured to radiate a signal; and
   a flexible printed circuit board (FPCB) comprising a first fastening area and an extension area extended from the first fastening area, the first fastening area electrically connected to the conductive portion, wherein the FPCB further comprises:
a dielectric substrate comprising a first surface and a second surface facing in a direction opposite to that of the first surface and facing the conductive portion;
a first conductive layer disposed on the first surface of the dielectric substrate, and
a first protective layer stacked on the first conductive layer, in the extension area and terminating in the first fastening area,
wherein in the first fastening area, the first conductive layer electrically contacts the conductive portion,
wherein the first fastening area comprises a screw through hole for screw fastening,
wherein at least one conductive via disposed at a periphery of the screw through hole extending from the dielectric substrate to the first conductive layer, and
wherein the conductive portion comprises a conductive bushing extended to an internal space of the electronic device, and comprising a screw fastener, and the first fastening area of the FPCB is fastened to the conductive bushing through a screw.

2. The electronic device of claim 1, further comprising a plating layer stacked on the first conductive layer in the first fastening area.

3. The electronic device of claim 1, further comprising a reinforcing member stacked on the first conductive layer in the first fastening area.

4. The electronic device of claim 1, further comprising:
a second conductive layer disposed on the second surface of the dielectric substrate; and
a second protective layer disposed on the second conductive layer, extending in the extension area and terminating in the first fastening area.

5. The electronic device of claim 1, further comprising: in the first fastening area,
a first additional dielectric layer stacked on the first conductive layer; and
a second conductive layer disposed on the first additional dielectric layer.

6. The electronic device of claim 1, further comprising a second fastening area extended from the extension area and electrically connected to an electrical structure disposed in the internal space of the electronic device.

7. The electronic device of claim 2, wherein the plating layer comprises gold.

8. The electronic device of claim 3, wherein the reinforcing member is made of at least one material of stainless steel (SUS), Al, or Cu.

9. The electronic device of claim 3, wherein the reinforcing member comprises polymer material.

10. The electronic device of claim 4, further comprising a reinforcing member stacked on the second conductive layer in the first fastening area.

11. The electronic device of claim 6, further comprising an electrical connector electrically connected to the first conductive layer and connected to a connector of the electrical structure in the second fastening area.

12. The electronic device of claim 6, wherein the electrical structure comprises a printed circuit board disposed in the internal space of the electronic device.

13. The electronic device of claim 10, wherein the reinforcing member comprises a polymer material.

14. An electronic device, comprising:
a side member including a conductive portion disposed between a pair of separated non-conductive portions in at least a portion of the side member, wherein the conductive portion is configured to radiate a signal;
an electrical structure spaced apart from the conductive portion;
a flexible printed circuit board (FPCB) comprising a first fastening area electrically connected to the conductive portion through screw fastening, an extension area extended from the first fastening area, and a second fastening area extended from the extension area and electrically connected to the electrical structure,
wherein the FPCB comprises:
a dielectric substrate comprising a first surface and a second surface facing in a direction opposite to that of the first surface and facing the conductive portion;
a first conductive layer disposed at the first surface of the dielectric substrate;
a first protective layer stacked on the first conductive layer in the extension area;
a second conductive layer disposed at the second surface of the dielectric substrate; and
a second protective layer stacked on the second conductive layer, in the extension area;
wherein in the first fastening area, the first conductive layer and the second conductive layer are electrically connected to the conductive portion;
a screw through hole for screw fastening in the first fastening area; and
at least one conductive via disposed at a periphery of the screw through hole and formed from the first conductive layer to the second conductive layer through the dielectric substrate in the first fastening area, and
wherein the conductive portion comprises a conductive bushing extended to an internal space of the electronic device and comprising a screw fastener, and the first fastening area of the FPCB is fastened to the conductive bushing through a screw.

15. The electronic device of claim 14, wherein the at least one conductive via is disposed to enclose along an edge of the screw through hole.

16. The electronic device of claim 14, wherein the electrical structure comprises a printed circuit board comprising a wireless communication circuit, and
the wireless communication circuit is configured to transmit or receive wireless signals of a specific frequency band through the conductive portion electrically connected by the FPCB.

* * * * *